United States Patent [19]

Sugawara

[11] Patent Number: 5,748,540
[45] Date of Patent: May 5, 1998

[54] PREVENTION OF ERRONEOUS OPERATION IN EQUALIZING OPERATION IN SEMICONDUCTOR MEMORY DEVICE

[75] Inventor: Michinori Sugawara, Tokyo, Japan

[73] Assignee: NEC Corporation, Japan

[21] Appl. No.: 715,642

[22] Filed: Sep. 18, 1996

[30] Foreign Application Priority Data

Oct. 13, 1995 [JP] Japan ................................ 7-291959

[51] Int. Cl.$^6$ ........................................... G11C 7/00
[52] U.S. Cl. ...................... 365/189.05; 365/203; 365/205
[58] Field of Search ........................... 365/189.05, 190, 365/205, 207, 203

[56] References Cited

U.S. PATENT DOCUMENTS

| | | | |
|---|---|---|---|
| 4,943,944 | 7/1990 | Sakui et al. | 365/189.05 |
| 5,068,831 | 11/1991 | Hoshi et al. | 365/203 |

OTHER PUBLICATIONS

Yasuhiko Maki, et al., "Session 8: Static RAMs, TPM 8.6: A 6.5ns 1Mb BiCMOS EL SRAM", IEEE International Solid-State Circuits Conference, Feb. 15, 1990, pp. 136-137.

Primary Examiner—Joseph A. Popek

[57] ABSTRACT

In a semiconductor memory device, a data is written in a memory cell through a pair of digit lines during a write operation time interval. An equalizing operation is performed to the pair of digit lines in response to an equalizing control signal during the write operation time interval to recover potentials of the digit lines. In order to suppress output change of a sense amplifier circuit on the equalizing operation, a load of the sense amplifier circuit is changed in response to the equalizing control signal by a flip-flop circuit such that the load becomes heavier than that before the equalizing operation. The flip-flop circuit is composed of a flip-flop section, and first and second transfer gates connected between the outputs of the sense amplifier circuit and the inputs of the flip-flop section. The first and second transfer gates are set to the conductive state in response to the equalizing control signal. The flip-flop section is composed of two inverter circuits which are connected such that an input of one of the two inverter circuits is connected to an output of the other and each inverter circuit is composed of a load and a transistor connected in series.

12 Claims, 8 Drawing Sheets

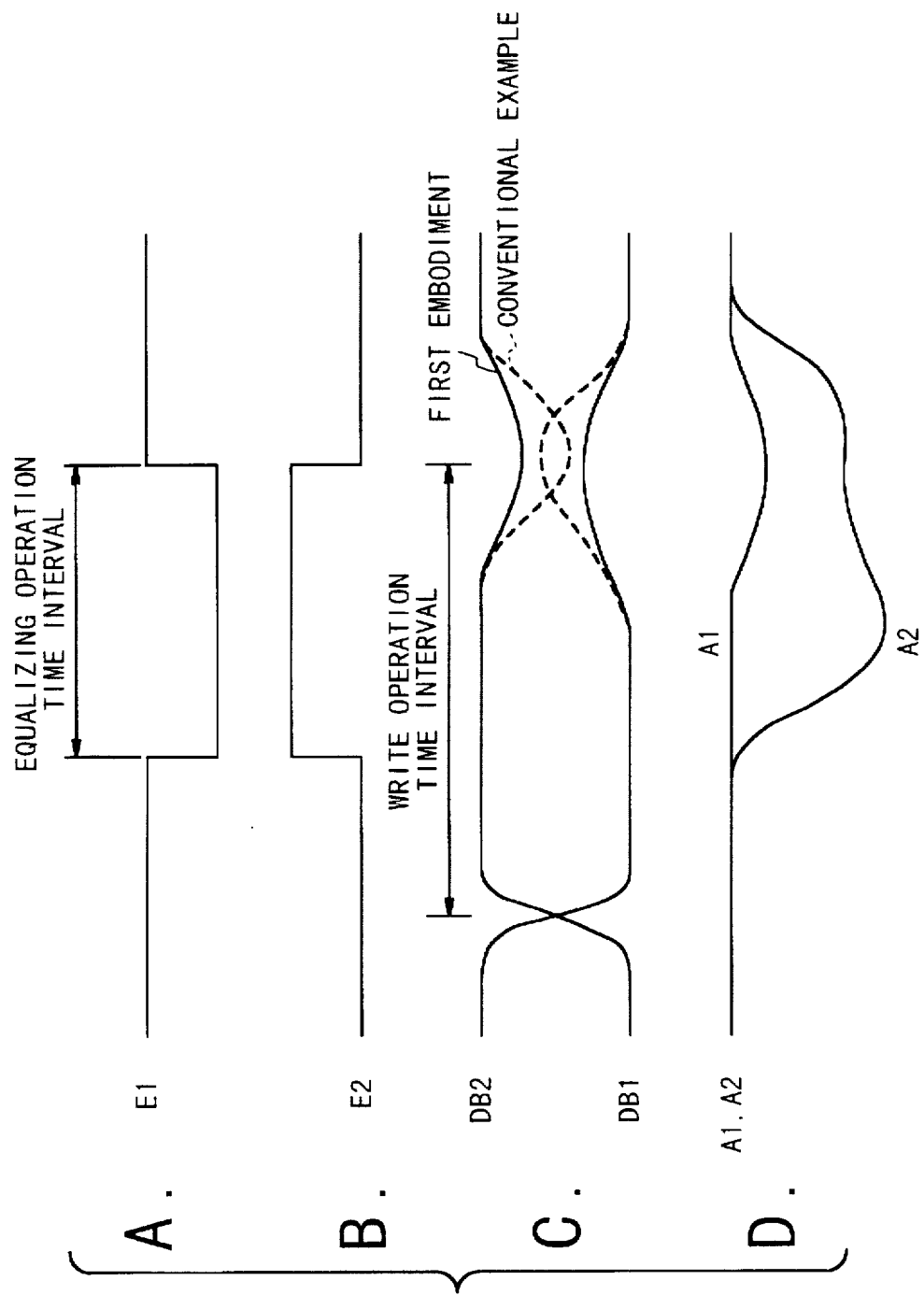

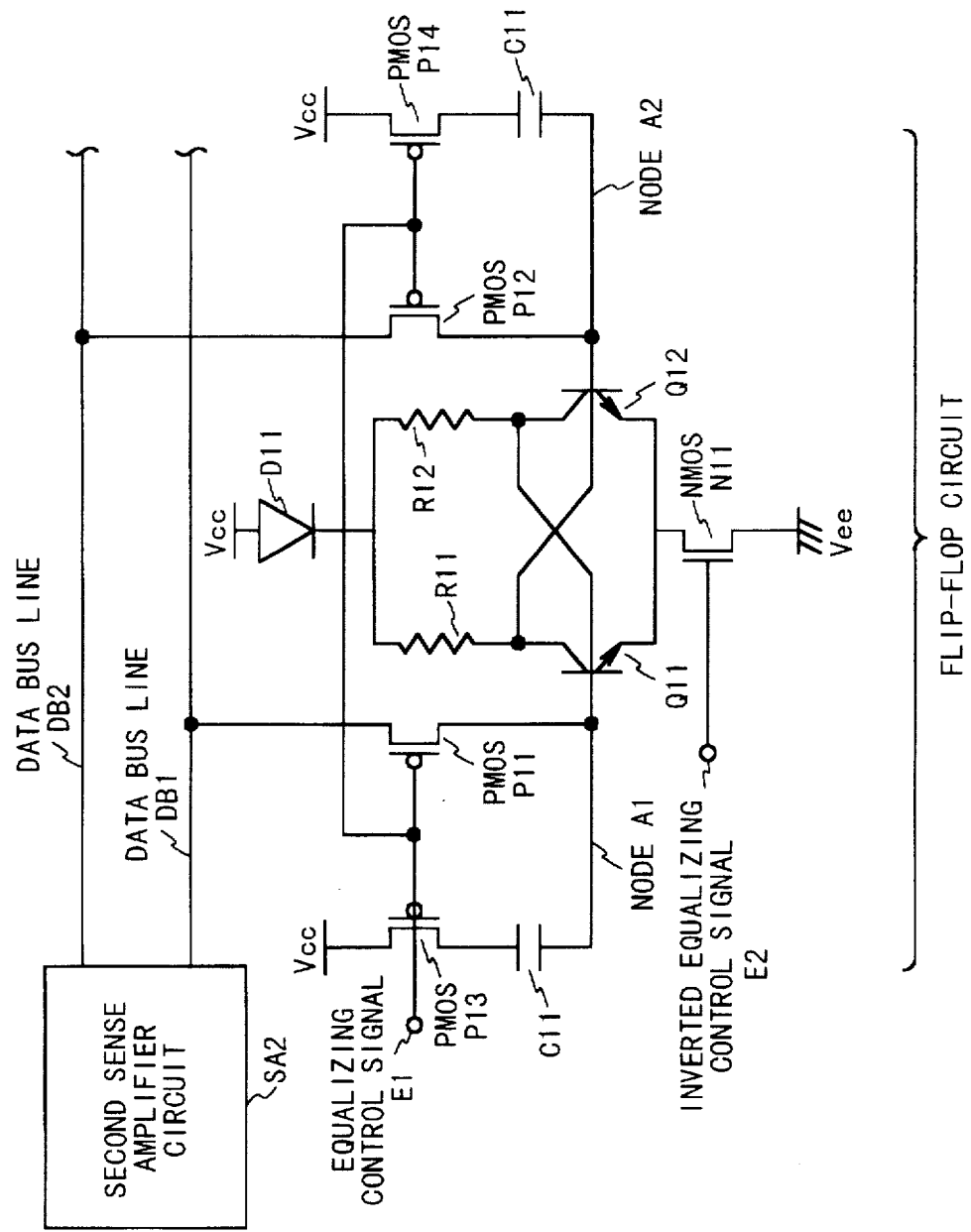

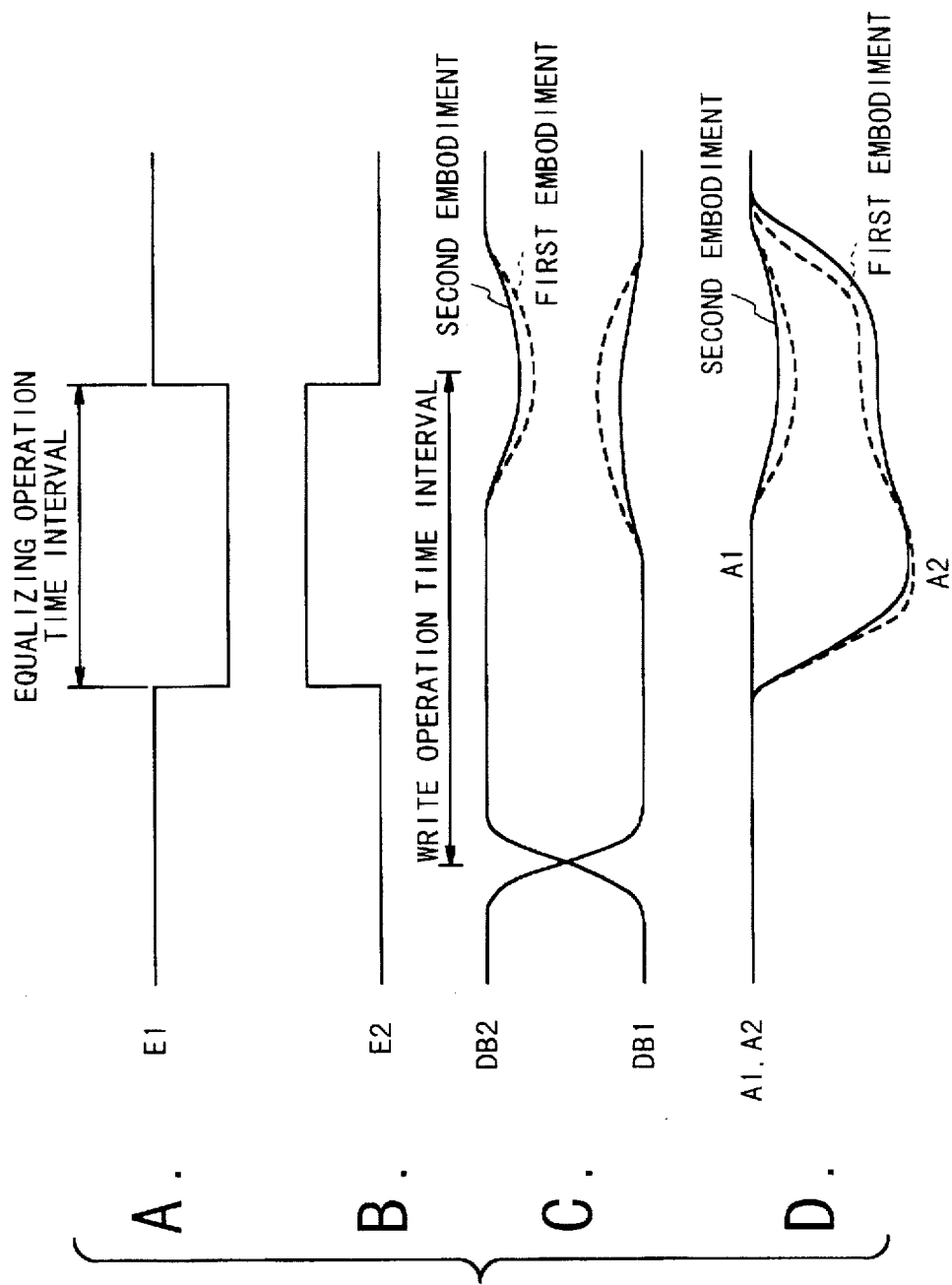

PREVENTION OF ERRONEOUS OPERATION IN EQUALIZING OPERATION IN SEMICONDUCTOR MEMORY DEVICE

BACKGROUND OF THE INVENTION

1. Field of the Invention

The present invention relates to a semiconductor memory device, and more particularly to prevention of an erroneous operation of a sense amplifier circuit at the time of an equalizing operation in a semiconductor memory device in which the equalizing operation is performed to recover the potentials of digit lines after write of a data to a memory cell.

2. Description of Related Art

FIG. 1 is a circuit diagram illustrating the structure of a conventional semiconductor memory device. Referring to FIG. 1, the structure of the conventional semiconductor memory device will be described below. The conventional semiconductor memory device has a memory cell M1 and a pair of digit lines D1 and D2 which are connected to the memory cell M1. The digit lines D1 and D2 are connected to an equalizing circuit which composed of P-channel MOS (PMOS) transistors P1, P2, and P3. The equalizing circuit performs an equalizing operation in response to an equalizing control signal E1 after a write operation of a data to the memory cell M1 to recover the potentials of the digit lines D1 and D2. In the equalizing circuit, the gates of the PMOS transistors P1, P2, and P3 are connected to the equalizing control signal E1. A source and drain of the PMOS transistor P1 are connected to the digit lines D1 and D2, respectively. A source and drain of the PMOS transistor P2 are connected to a high potential side power supply Vcc and the digit line D1, respectively. A source and drain of the PMOS transistor P3 are connected to the high potential side power supply Vcc and the digit line D2, respectively. The pair of digit lines D1 and D2 is connected to a first sense amplifier circuit SA1. The first sense amplifier circuit SA1 converts a difference between the digit lines D1 and D2 in potential into a current and amplifies the current difference to output the converted current. More particularly, the first sense amplifier circuit SA1 is composed of a pair of transistors whose emitters are connected to a constant current source in common, and operates as a differential-type voltage—current converting amplifier (transconductance amplifier) to output the amplified difference current in accordance with the differential input voltages. The outputs of the first sense amplifier circuit SA1 are supplied to a second sense amplifier circuit SA2 in a differential manner. More particularly, the second sense amplifier circuit SA2 is composed of a pair of transistors of an input stage and an emitter follower-type transistors. The bases of the pair of transistors in the input stage are biased in common and input the amplified difference current from the first sense amplifier circuit SA1. The emitter follower-type transistors output complementary-type output voltages based on the voltage drops which appear in load resistors of said pair of transistors in the input stage in accordance with the inputted difference current. The complementary outputs of the second sense amplifier circuit SA2 are supplied to an output circuit O1 through data bus lines DB1 and DB2 in a differential manner. In this manner, the data read out from the memory cell M1 is outputted from the output terminal OUT of the output circuit O1. In a case where the semiconductor memory device is of an asynchronous type, the output circuit O1 is composed of an output buffer (not shown). On the other hand, in a case where the semiconductor memory device is of a synchronous type, the output circuit O1 is composed of an output register for latching the complementary data on the data bus lines DB1 and DB2 in accordance with a predetermined clock signal, and an output buffer connected to the output terminals of the output register (both are not shown).

Next, the operation of the conventional semiconductor memory will be described. As shown in the wave forms of FIGS. 2A to 2C, in the conventional semiconductor memory device, the potential difference between the digit lines D1 and D2 is about 50 mV in a read operation and about power supply voltage, e.g., about 5 V in a write operation, as shown in FIG. 2B by Sv. For this reason, an equalizing operation needs to be performed after the write operation such that the address access time is not delayed. More particularly, an equalizing control signal E1 is set to the Low level during an end portion of the write operation, so that the PMOS transistors P1, P2 and P3 to whose gates the equalizing control signal is inputted are all set to the ON state. As a result, the voltage difference between the digit lines D1 and D2 is rapidly changed from the power supply voltage (voltage Sv) in the write operation time interval to a voltage as much as 50 mV. At the same time, the potentials of both digit lines D1 and D2 is shifted near to the high potential side power supply of Vcc.

In this case, however, in the above-mentioned conventional semiconductor memory device, there is a problem in that the potentials on the digit lines D1 and D2 become too close during the equalizing operation time interval, even if temporary, as shown in FIG. 2B. As a result, the potentials of the data bus lines DB1 and DB2 which are outputted from the second sense amplifier circuit SA2 in the complementary manner approaches the middle level together. Especially, in the worst case, there is a problem in that the potential relation on the data bus lines DB1 and DB2 is inverted because of variation in size of components of the memory cell M1 and sense amplifier circuits and so on, as shown in FIG. 2C. As a result, in a case of the asynchronous type semiconductor memory device, glitch noise is generated at the output terminal OUT of the output circuit, as shown in FIG. 3A. On the other hand, in a case of the synchronous type semiconductor memory device, the data on data bus lines D1 and D2 would be possibly latched by the output register of the output circuit O1 at the timing when the potential relation on the data bus lines DB1 and DB2 is inverted. In this case, the erroneous operation is caused that a signal which is opposite to a signal originally to be outputted is outputted from the output terminal OUT, as shown in FIG. 3B.

SUMMARY OF THE INVENTION

Therefore, the present invention has, as an object, to a method and device in which an erroneous or noisy operation during an equalizing operation can be reliably avoided in a semiconductor memory device which performs the equalizing operation to recover of the potentials of digit lines after a write operation of a data to a memory cell.

In order to achieve an aspect of the present invention, a semiconductor memory device includes a memory cell for storing a data, a sense amplifier section for amplifying the data read out from said memory cell to output the amplified data onto a pair of output signal lines in a complementary manner, an output circuit section connected to said pair of output signal lines, for outputting the data from the pair of output signal lines, and a flip-flop circuit connected to the pair of output signal lines in response to an equalizing control signal such that said flip-flop circuit becomes operable.

The flip-flop circuit may be composed of a flip-flop section, and first and second transfer gates connected between the output signal lines and inputs of the flip-flop section and operating in response to the equalizing control signal such that the two transfer gates are set to an conductive state, respectively. Alternatively, the flip-flop circuit may be composed of a flip-flop section, first and second transfer gates connected between the output signal lines and inputs of the flip-flop section, and operating in response to the equalizing control signal such that the two transfer gates are set to an conductive state, respectively, a third transfer gate and a first capacitor which are connected in series between a higher potential side power supply line and one of the inputs of the flip-flop section, and a fourth transfer gate and a second capacitor which are connected in series between the higher potential side power supply line and the other of the inputs of the flip-flop section, wherein the third and fourth transfer gates operates in response to the equalizing control signal such that the third and fourth transfer gates are set to conductive state. In either case, the flip-flop section can be composed of two inverter circuits which are connected such that an input of one of the two inverter circuits is connected to an output of the other, and each inverter circuit can be composed of a load and a transistor connected in series.

In order to achieve another aspect of the present invention, a method of suppressing output change of a sense amplifier circuit on an equalizing operation, includes the steps of:

writing a data in a memory cell through a pair of digit lines during a write operation time interval;

execution an equalizing operation to the pair of digit lines in response to an equalizing control signal during the write operation time interval to recover potentials of the digit lines;

changing, in response to the equalizing control signal, a load of a sense amplifier circuit which connected to the memory cell through the pair of digit lines such that the load becomes heavier than that before the equalizing control signal.

In this case, first and second transfer gates may be set to a conductive state in response to the equalizing control signal such that a flip-flop circuit is connected to complementary output lines of the sense amplifier circuit, wherein the flip-flop circuit is composed of a flip-flop, and the first and second transfer gates connected between the complementary output lines and inputs of the flip-flop. Alternatively, an output signal from the sense amplifier circuit on the complementary output lines is delayed such that a maximum change point of the output signal during the equalizing operation time interval when the load is not changed in response to the equalizing control signal is shifted outside of the equalizing operation time interval.

BRIEF DESCRIPTION OF THE DRAWINGS

FIGS. 6(A to D) is a diagram illustrating signal wave forms to explain the operation of the flip-flop circuit in the semiconductor memory device according to the first embodiment of the present invention;

FIG. 7 is a circuit diagram illustrating the structure of a flip-flop circuit in the semiconductor memory device according to a second embodiment of the present invention; and FIGS. 8(A to D) is a diagram illustrating signal wave forms to explain the operation of the flip-flop circuit in the semiconductor memory device according to the second embodiment of the present invention.

DESCRIPTION OF THE PREFERRED EMBODIMENTS

A semiconductor memory device of the present invention will be described in detail with reference to the accompanying drawing.

Figure 1:
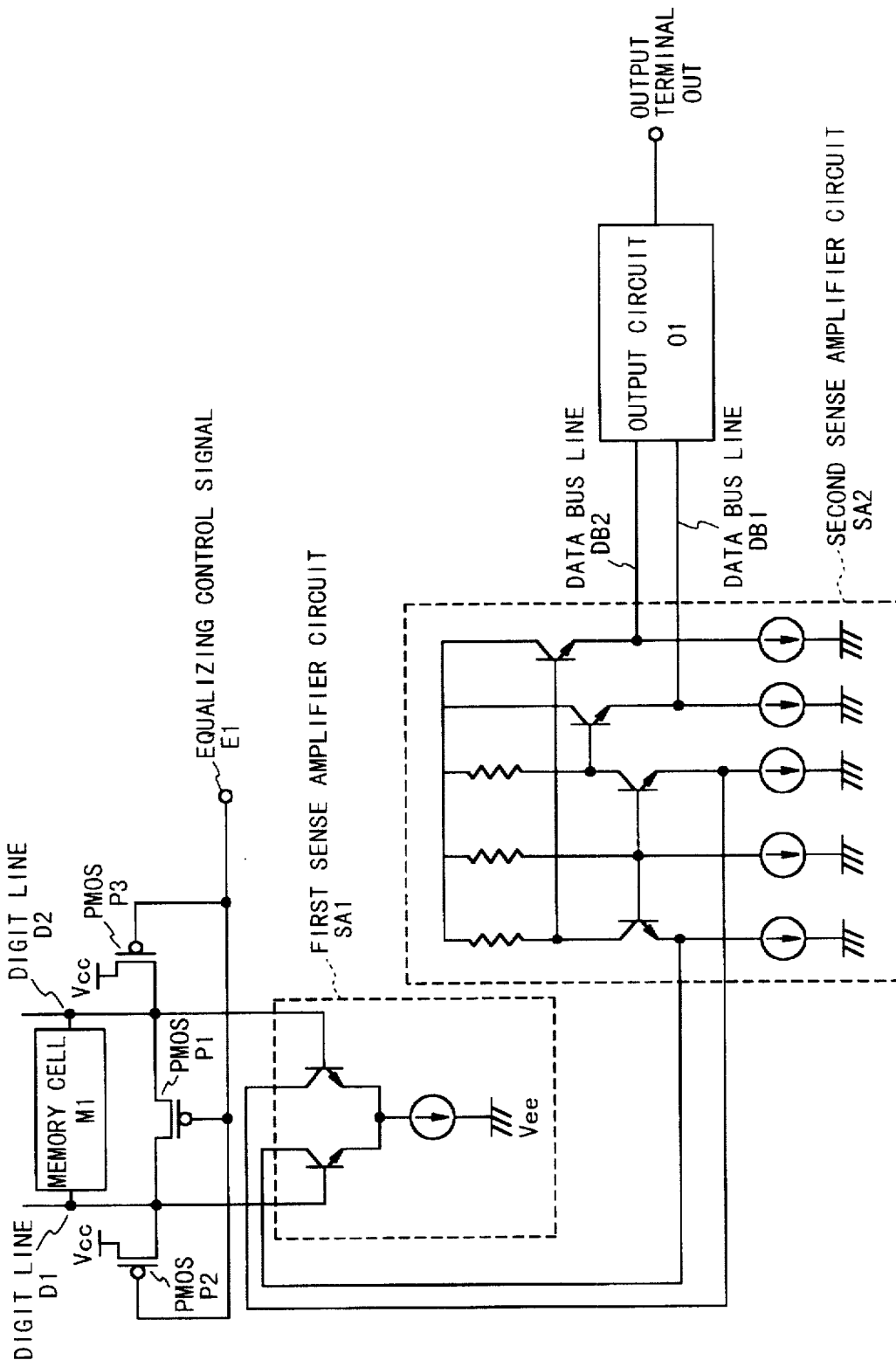
FIG. 1 is a circuit diagram illustrating the structure of a conventional semiconductor memory device.
Figure 2:
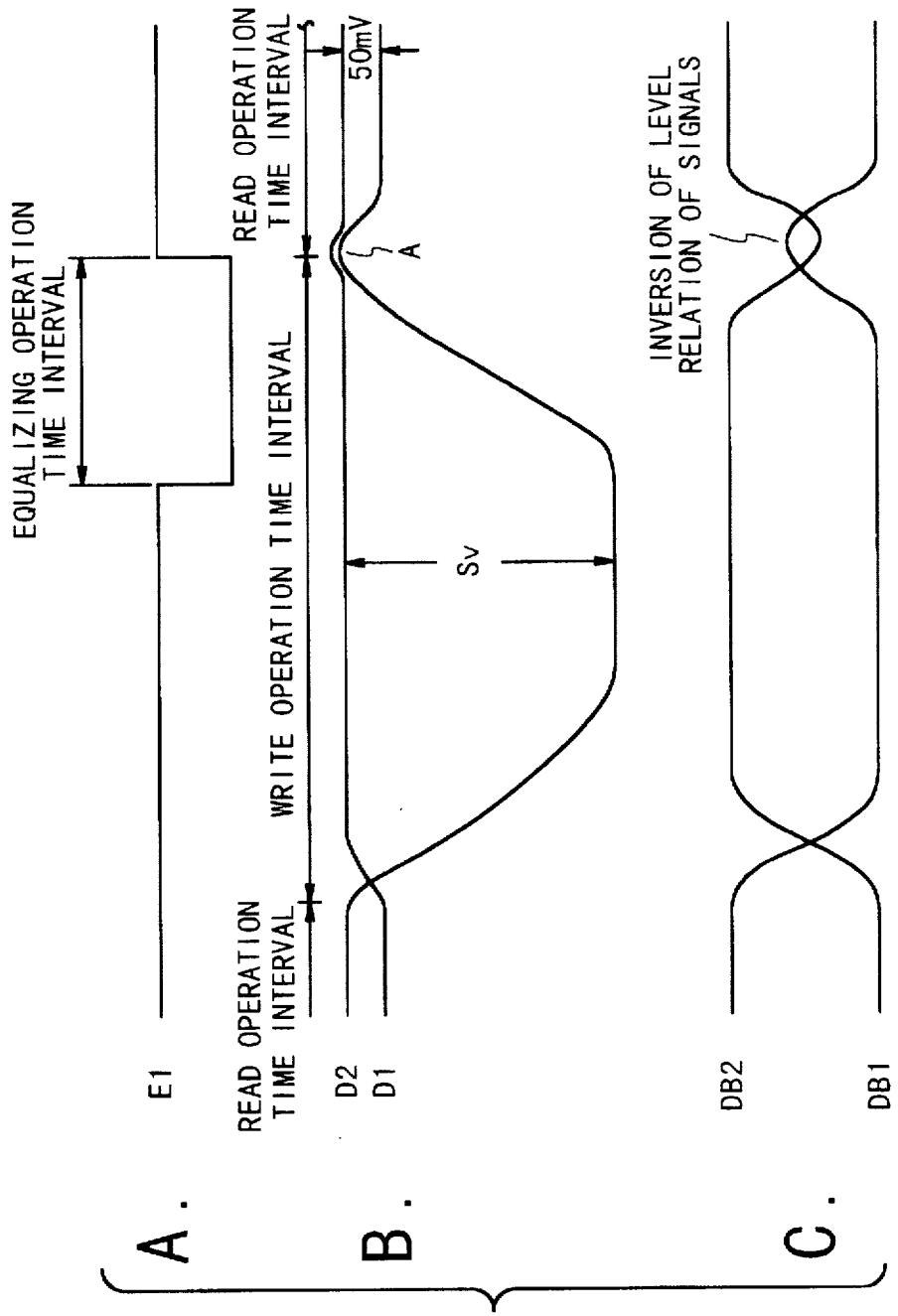
FIGS. 2(A to C) is a diagram illustrating signal wave forms to explain the operation of the conventional semiconductor memory device.
Figure 3:
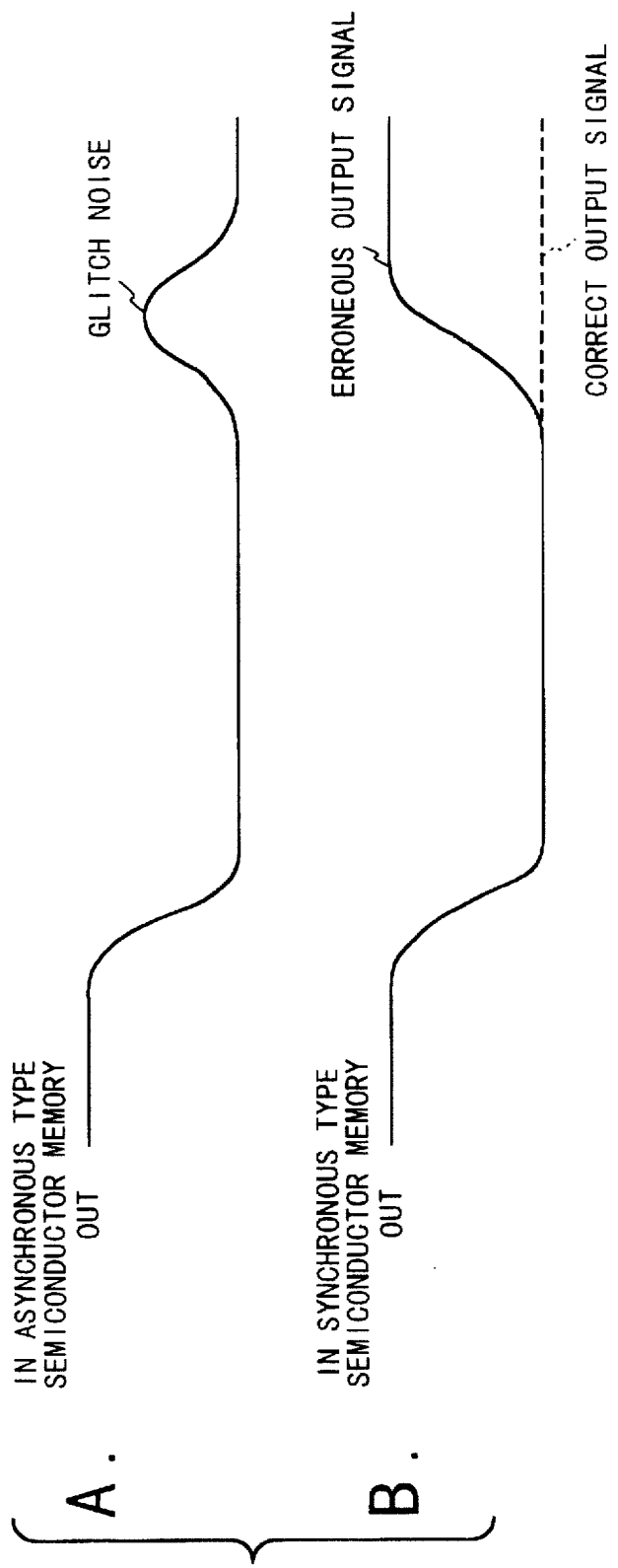
FIGS. 3(A and B) is a diagram illustrating signal wave forms to explain problems in the conventional semiconductor memory device.
Figure 4:
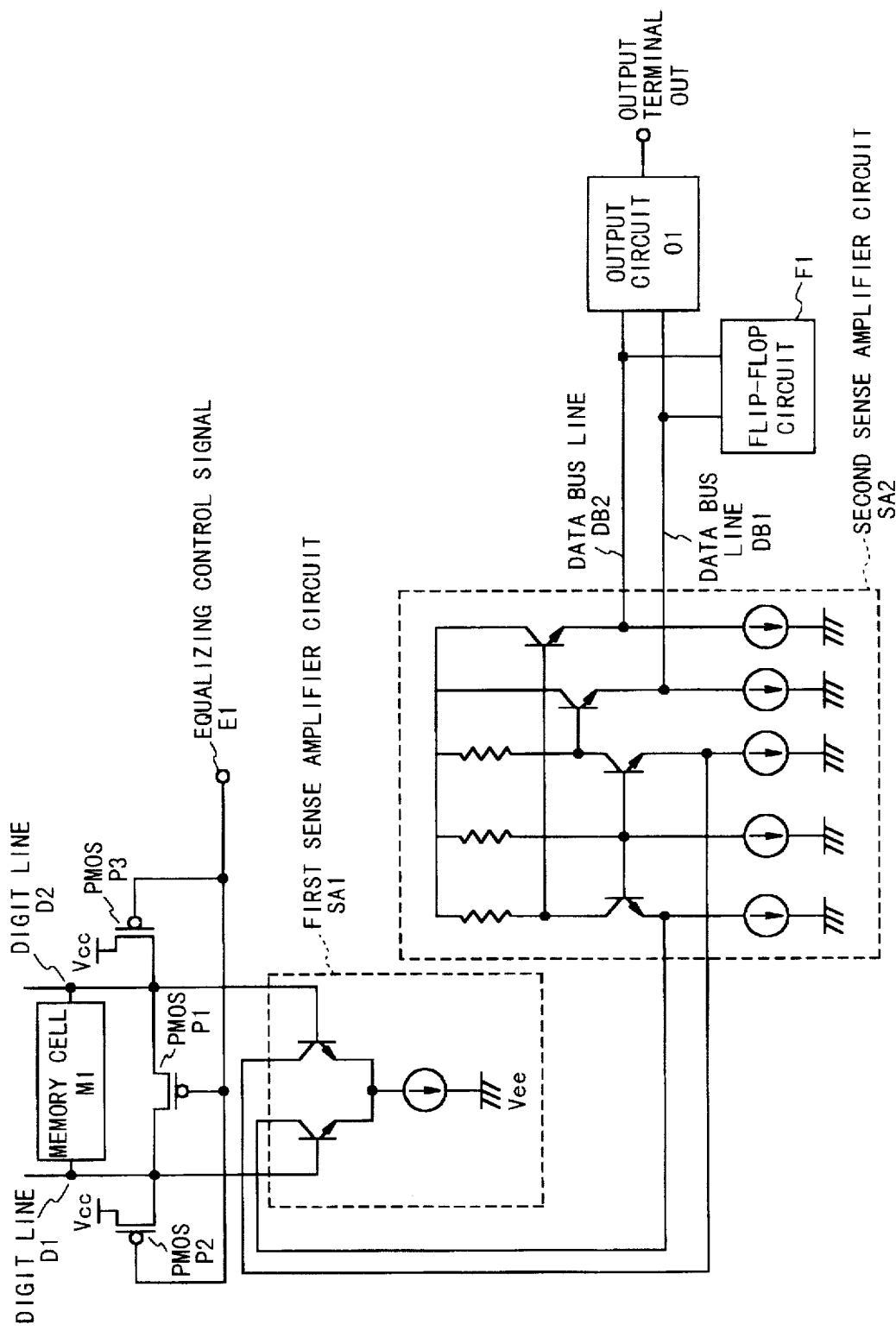
FIG. 4 is a diagram illustrating the structure of a semiconductor memory device according to the present invention.

FIG. 4 is a circuit diagram illustrating the structure of a semiconductor memory device of the present invention. Referring to FIG. 4, the semiconductor memory device of the present invention has a memory cell M1 and a pair of digit lines D1 and D2 which are connected to the memory cell M1. The digit lines D1 and D2 are connected to an equalizing circuit which composed of P-channel MOS (PMOS) transistors P1, P2, and P3. The equalizing circuit performs an equalizing operation in response to an equalizing control signal E1 during an end portion of a write operation of a data to the memory cell M1 to recover the potentials of the digit lines D1 and D2. In the equalizing circuit, the gates of the PMOS transistors P1, P2, and P3 are connected to the equalizing control signal E1. A source and drain of the PMOS transistor P1 are connected to the digit lines D1 and D2, respectively. A source and drain of the PMOS transistor P2 are connected to a high potential side power supply Vcc and the digit line D1, respectively. A source and drain of the PMOS transistor P3 are connected to the high potential side power supply Vcc and the digit line D2, respectively. The pair of digit lines D1 and D2 is connected to a first sense amplifier circuit SA1.

The first sense amplifier circuit SA1 converts and amplifies a difference between the digit lines D1 and D2 in potential into a current to output the converted and amplified current. More particularly, the first sense amplifier circuit SA1 is composed of a pair of transistors whose emitters are connected to a constant current source in common, and operates as a differential-type voltage—current converting amplifier (transconductance amplifier) to output the amplified difference current in accordance with the differential input voltages. The outputs of the first sense amplifier circuit SA1 are supplied to a second sense amplifier circuit SA2 in a differential manner. More particularly, the second sense amplifier circuit SA2 is composed of a pair of transistors of an input stage and an emitter follower-type transistors of a second stage. The bases of the pair of transistors in the input stage are biased in common and input the amplified difference current from the first sense amplifier circuit SA1. The emitter follower-type transistors output complementary-type output voltages based on the voltage drops which appear in load resistors of said pair of transistors in the input stage in accordance with the inputted difference current.

The complementary outputs of the second sense amplifier circuit SA2 are supplied to an output circuit O1 through data bus lines DB1 and DB2 in a differential manner. The data bus lines DB1 and DB2 are also connected to a flip-flop circuit F1 in response to the equalizing control signal E1. Since the flip-flop circuit F1 is connected to the data bus lines DB1 and DB2, the load of the second sense amplifier circuit SA2 is changed to a heavier state. That is, the change of the signals on the data bus lines DB1 and DB2 are delayed.

In this manner, the data read out from the memory cell M1 is outputted from the output terminal OUT of the output circuit 01. In a case where the semiconductor memory device is of an asynchronous type, the output circuit 01 is composed of an output buffer (not shown). On the other hand, in a case where the semiconductor memory device is of a synchronous type, the output circuit 01 is composed of an output register for latching the complementary data on the data bus lines DB1 and DB2 in accordance with a predetermined clock signal, and an output buffer connected to the output terminals of the output register (both are not shown).

Figure 5:
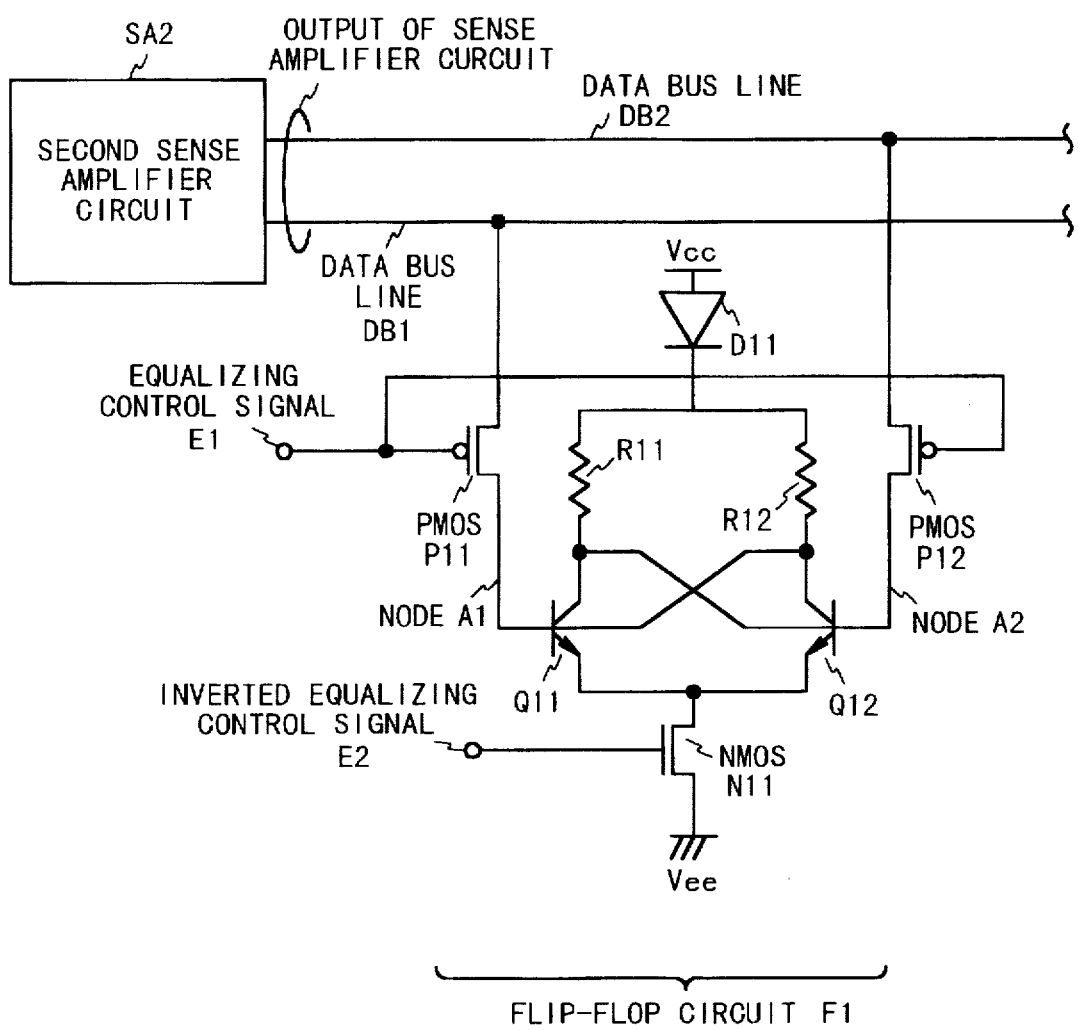
FIG. 5 is a circuit diagram illustrating the structure of a flip-flop circuit in the semiconductor memory device according to a first embodiment of the present invention.

FIG. 5 is a diagram illustrating the structure of a flip-flop circuit F1 in the semiconductor memory device according to the first embodiment of the present invention. Referring to FIG. 5, in the semiconductor memory device according to the first embodiment, the flip-flop circuit F1 is composed of a flip-flop section, a first PMOS transistor P11 as a transfer gate whose source is connected to the data bus line DB1 which is connected to the output of the second sense amplifier circuit SA2 and whose drain is connected to a node A1, and a second PMOS transistor P12 as a transfer gate whose source is connected to the data bus line DB2 which is connected to the output of the second sense amplifier circuit SA2 and whose drain is connected to a node A2. The equalizing control signal E1 is supplied to the gate of each of the PMOS transistors P11 and P12.

The flip-flop section is composed of NPN bipolar transistors Q11 and Q12 whose bases are connected to the nodes A1 and A2, respectively, load resistors R11 and R12 connected to the high potential side power supply Vcc via a diode D11 and the collectors of the NPN bipolar transistors Q11 and Q12, respectively, and an NMOS transistor N11 (acting as a constant current source in the conductive state) whose drain is connected to the emitters of the NPN bipolar transistors Q11 and Q12 in common and to the ground potential Vee. An inverted equalizing control signal E2 which is obtained by inverting the equalizing control signal E2 is supplied to the gate of the NMOS Nil. Also, the base of the NPN bipolar transistor Q11 is connected to the collector of the NPN bipolar transistor Q12 and the base of the NPN bipolar transistor Q12 is connected to the collector of the NPN bipolar transistor Q11 in a cross manner.

Next, the operation of the semiconductor memory device according to the first embodiment of the present invention will be described with reference to the signal wave forms shown in FIGS. 6A to 6D. Referring to FIGS. 6A to 6D, the equalizing control signal E1 is set to an active state (Low level) for the equalizing operation in an end portion of the write operation time interval, as shown in FIG. 6A. As a result, the inverted equalizing control signal E2 is set to the High level, as shown in FIG. 6B. Therefore, the PMOS transistors P11 and P12 which act as the transfer gate are set to the conductive state in the flip-flop circuit F1. At the same time, the NMOS transistor N11 is also set to the conductive state in the flip-flop section. As a result, the potentials of the nodes A1 and A2 transit as shown in FIG. 6D, i.e., the nodes have the potentials equal to those of the input/output terminals of the flip-flop section. That is, the voltage levels of the nodes A1 and A2 are first separated into the High level and the Low level in correspondence with the complementary output levels on the data bus lines DB1 and DB2. Then, the voltage levels of the nodes A1 and A2 come close to each other as the voltage levels (the potentials) of the data bus lines DB1 and DB2 approach each other during the above-mentioned equalizing operation. At this time, the flip-flop circuit F1 acts as a load to the data bus lines DB1 and DB2. As a result, the change of the potentials on the data bus lines DB1 and DB2 are delayed, so that the inversion of the voltage level relation is not caused. Thereafter, when the equalizing operation is ended, the equalizing control signal E1 is set to the High level so that the inverted equalizing control signal E2 is set to the Low level. As a result, the NMOS transistor N11 changes to the non-conductive state so that the flip-flop circuit F1 is deactivated, i.e., the flip-flop circuit F1 does not operate effectively. In this manner, since the PMOS transistors P11 and P12 are turned off, the following data read operation is not influenced by the PMOS transistors P11 and P12.

In the first embodiment, the signals on the data bus lines DB1 and DB2 are delayed and the equalizing operation time interval is ended before the inversion of the voltage level relation is caused. Therefore, the inversion of any voltage level relation is not caused in the present embodiment, although the inversion of the voltage level relation is caused in the conventional semiconductor memory device, as shown in FIG. 6C.

Next, the semiconductor memory device according to the second embodiment of the present invention will be described. FIG. 7 is a diagram illustrating the structure of a flip-flop circuit F1 in the semiconductor memory device according to the second embodiment of the present invention. Referring to FIG. 7, in the semiconductor memory device according to the second embodiment, a flip-flop circuit F1 is composed of a flip-flop section, a first PMOS transistor P11 as a transfer gate whose source is connected to the data bus line DB1 which is connected to the output of the second sense amplifier circuit SA2 and whose drain is connected to a node A1, and a second PMOS transistor P12 as a transfer gate whose source is connected to the data bus line DB2 which is connected to the output of the second sense amplifier circuit SA2 and whose drain is connected to a node A2. In the second embodiment, the flip-flop circuit further includes PMOS transistors P13 and P14 whose sources are connected to the high potential side power supply Vcc. The drains of the PMOS transistors P13 and P14 are connected to the nodes A1 and A2 via capacitors C11 and C11', respectively. The equalizing control signal E1 is supplied to the gate of each of the PMOS transistors P11, P12, P13 and P14.

The flip-flop circuit F1 is composed of NPN bipolar transistors Q11 and Q12 whose bases are connected to the nodes A1 and A2, respectively, load resistors R11 and R12 connected to the high potential side power supply Vcc via a diode D11 and the collectors of the NPN bipolar transistors Q11 and Q12, respectively, and an NMOS transistor N11 (acting as a constant current source in the conductive state) whose drain is connected to the emitters of the NPN bipolar transistors Q11 and Q12 in common and to the ground potential Vee. An inverted equalizing control signal E2 which is obtained by inverting the equalizing control signal E2 is supplied to the gate of the NMOS N11. Also, the base of the NPN bipolar transistor Q11 is connected to the collector of the NPN bipolar transistor Q12 and the base of the NPN bipolar transistor Q12 is connected to the collector of the NPN bipolar transistor Q11.

Next, the operation of the semiconductor memory device according to the second embodiment will be described with reference to FIGS. 8A to 8D. In the signal wave forms shown in FIGS. 8C and 8D, the slid line shows the wave form in the second embodiment and the dashed line shows the wave form in the first embodiment.

In the second embodiment, at the time when the equalizing operation is started, the capacitors C11, C11' does not operate, i.e., they do not act as the load not so much, because the PMOS transistors P13 and P14 are set to the non-conductive state. Therefore, it is not prevented the potentials of the nodes A1, A2 are separated into the High level and the Low level. However, the time required to separate the potentials of the nodes A1 and A2 into the High level and the Low level, e.g., to fall the node A2 to the ground potential level is delayed slightly, as shown in FIG. 8D. Next, the potential levels on the data bus lines DB1 and DB2 approach each other during the equalizing operation, so that the potential level of the level of the nodes A1 and A2 also approach. Since the PMOS transistors P13 and P14 have been turned on at this time, the potential change is suppressed and delayed by the function of the capacitors C11 and C11', compared to the case of the above-mentioned first embodiment, as shown in FIG. 8C. In this manner, in this embodiment, the erroneous operation during the equalizing operation can be more reliably prevented by adding the capacitors C11 and C11' to the flip-flop circuit F1 so as to connect to the nodes A1 and A2.

Although the embodiments are described as above, the structure of the sense amplifier circuit or the like in FIG. 4 which is referred to to describe the embodiments of the present invention does not limit the present invention, of course. Also, although the example in which the flip-flop section is composed of two inverters each of which includes a resistor and a bipolar transistor was described, the flip-flop structure of the present invention is not limited only to the bipolar transistors, of course.

As described above, according to the semiconductor memory device of the present invention, the transfer gates which are controlled by the equalizing control signal are connected to the flip-flop section and to the data bus lines to which the outputs of the sense amplifier circuit are connected. Therefore, the approach of the signals on the data bus line or the inversion of the signal level relation can be prevented in the equalizing operation.

What is claimed is:

1. A semiconductor memory device comprising:
   a memory cell for storing data;
   a sense amplifier amplifying the data read out from said memory cell to output the amplified data onto a pair of output signal lines in a complementary manner;
   an output circuit connected to said pair of output signal lines, and outputting the data from the pair of output signal lines; and
   a flip-flop circuit connected to the pair of output signal lines and connected in parallel to said output circuit, said flip-flop circuit becomes operable in response to an equalizing control signal.

2. A semiconductor memory device according to claim 1, wherein said flip-flop circuit is composed of a flip-flop section, and first and second transfer gates connected between the output signal lines and inputs of the flip-flop section and operating in response to the equalizing control signal such that the two transfer gates are set to an conductive state, respectively.

3. A semiconductor memory device according to claim 2, wherein said flip-flop section is composed of two inverter circuits which are connected such that an input of one of the two inverter circuits is connected to an output of the other, each inverter circuit being composed of a load and a transistor connected in series.

4. A semiconductor memory device according to claim 1, wherein said flip-flop circuit includes a flip-flop section, first and second transfer gates connected between the output signal lines and inputs of the flip-flop section, and operating in response to the equalizing control signal such that the first and second transfer gates are set to a conductive state, respectively, a third transfer gate and a first capacitor which are connected in series between a higher potential side power supply line and one of the inputs of the flip-flop section, and a fourth transfer gate and a second capacitor which are connected in series between the higher potential side power supply line and the other of the inputs of the flip-flop section, wherein the third and fourth transfer gates operate in response to the equalizing control signal such that the third and fourth transfer gates are set to the conductive state.

5. A semiconductor memory device according to claim 4, wherein said flip-flop section includes two inverter circuits which are connected such that an input of one of the two inverter circuits is connected to an output of the other, each inverter circuit being composed of a load and a transistor connected in series.

6. A method of suppressing output change of a sense amplifier circuit on an equalizing operation, comprising the steps of:
   writing data in a memory cell through a pair of digit lines during a write operation time interval;
   executing an equalizing operation to the pair of digit lines in response to an equalizing control signal during the write operation time interval to recover potentials of the digit lines; and
   changing, in response to the equalizing control signal, a load of a sense amplifier circuit connected to the memory cell through the pair of digit lines such that a magnitude of the load becomes larger than the magnitude of the load before the equalizing control signal.

7. A method according to claim 6, wherein said changing step includes setting first and second transfer gates to a conductive state in response to the equalizing control signal such that a flip-flop circuit is connected to complementary output lines of the sense amplifier circuit, the flip-flop circuit is composed of a flip-flop, and the first and second transfer gates connected between the complementary output lines and inputs of the flip-flop.

8. A method according to claim 6, wherein said changing step includes delaying an output signal from the sense amplifier circuit on complementary output lines such that a maximum change point of the output signal during the equalizing operation time interval when the load is not changed in response to the equalizing control signal is shifted outside of the equalizing operation time interval.

9. A semiconductor memory device comprising:
   a memory cell for storing data;
   a sense amplifier amplifying the data read out from said memory cell to output the amplified data onto a pair of output signal lines in a complementary manner;
   an output circuit connected to said pair of output signal lines, and outputting the data from the pair of output signal lines; and
   a flip-flop circuit connected to the pair of output signal lines said flip-flop circuit becomes operable in response to an equalizing control signal;
   said flip-flop circuit including a flip flop section, first and second transfer gates connected between the output signal lines and inputs of the flip-flop section, and operating in response to the equalizing control signal such that said first and second transfer gates are set to a conductive state, respectively, a third transfer gate and a first capacitor which are connected in series between a higher potential side power supply line and one of the inputs of the flip-flop section, and fourth transfer gate and a second capacitor which are connected in series between the higher potential side power supply line and the other of the inputs of the flip-flop section, said third and fourth transfer gates operate in response to the equalizing control signal such that said third and fourth transfer gates are set to the conductive state.

10. A semiconductor memory device according to claim 9, wherein said flip-flop section includes two inverter circuits which are connected such that an input of one of the two inverter circuits is connected to an output of the other, each inverter circuit being composed of a load and a transistor connected in series.

11. A method of suppressing output change of a sense amplifier circuit on an equalizing operation, comprising the steps of:

writing data in a memory cell through a pair of digit lines during a write operation time interval;

executing an equalizing operation to the pair of digit lines in response to an equalizing control signal during the write operation time interval to recover potentials of the digit lines;

changing, in response to the equalizing control signal, a load of a sense amplifier circuit connected to the memory cell through the pair of digit lines such that a magnitude of the load becomes larger than the magnitude of the load before the equalizing control signal; and said changing step including delaying an output signal from the sense amplifier circuit on complementary output lines such that a maximum change point of the output signal during the equalizing operation time interval when the load is not changed in response to the equalizing control signal is shifted outside of the equalizing operation time interval.

12. A method according to claim 11, wherein said changing step includes setting first and second transfer gates to a conductive state in response to the equalizing control signal such that a flip-flop circuit is connected to complementary output lines of the sense amplifier circuit, the flip-flop circuit is composed of a flip-flop, and the first and second transfer gates connected between the complementary output lines and inputs of the flip-flop.

* * * * *